(12) United States Patent
Sekiya (10) Patent No.: US 9,806,057 B2
(45) Date of Patent: Oct. 31, 2017

(54) CHIP ARRANGING METHOD

(71) Applicant: DISCO CORPORATION, Tokyo (JP)

(72) Inventor: Kazuma Sekiya, Tokyo (JP)

(73) Assignee: Disco Corporation, Tokyo (JP)

( * ) Notice: Subject to any disclaimer, the term of this patent is extended or adjusted under 35 U.S.C. 154(b) by 69 days.

(21) Appl. No.: 14/643,831

(22) Filed: Mar. 10, 2015

(65) Prior Publication Data

US 2015/0262971 A1 Sep. 17, 2015

(30) Foreign Application Priority Data

Mar. 11, 2014 (JP) .................................. 2014-047928

(51) Int. Cl.
*H01L 21/00* (2006.01)
*H01L 23/00* (2006.01)
*H01L 21/683* (2006.01)

(52) U.S. Cl.
CPC .......... *H01L 24/97* (2013.01); *H01L 21/6835* (2013.01); *H01L 24/19* (2013.01); *H01L 24/80* (2013.01); *H01L 24/83* (2013.01); *H01L 24/95* (2013.01); *H01L 24/08* (2013.01); *H01L 24/27* (2013.01); *H01L 24/29* (2013.01); *H01L 24/32* (2013.01); *H01L 2221/68359* (2013.01); *H01L 2221/68368* (2013.01); *H01L 2224/08225* (2013.01); *H01L 2224/26175* (2013.01); *H01L 2224/27013* (2013.01); *H01L 2224/27334* (2013.01); *H01L 2224/29194* (2013.01); *H01L 2224/32225* (2013.01); *H01L 2224/80143* (2013.01); *H01L 2224/80385* (2013.01); *H01L 2224/80904* (2013.01); *H01L 2224/80907* (2013.01); *H01L 2224/8385* (2013.01); *H01L 2224/83143* (2013.01); *H01L 2224/83192* (2013.01); *H01L 2224/83385* (2013.01);

(Continued)

(58) Field of Classification Search
CPC ......... H01L 24/97; H01L 24/83; H01L 24/80; H01L 24/95; H01L 21/6835; H01L 24/19; H01L 2224/95146; H01L 2221/68359; H01L 2221/68368; H01L 24/32; H01L 2224/80907; H01L 2224/97; H01L 24/27; H01L 2224/83192; H01L 24/29
USPC ....................................................... 438/107
See application file for complete search history.

(56) References Cited

U.S. PATENT DOCUMENTS

| 8,268,676 B2 * | 9/2012 | Krishnan .......... H01L 23/49541 257/E21.506 |
| 2007/0001278 A1 * | 1/2007 | Jeon ...................... H01L 21/561 257/676 |

(Continued)

FOREIGN PATENT DOCUMENTS

JP 2013-058520 3/2013

*Primary Examiner* — Phat X Cao
*Assistant Examiner* — Mohammad M Hoque
(74) *Attorney, Agent, or Firm* — Greer Burns & Crain Ltd.

(57) ABSTRACT

A chip arranging method for arranging a plurality of chips on a wafer includes a groove forming step of forming a plurality of intersecting grooves that mark off each of chip placement regions on the front surface side of the wafer, a liquid supplying step of supplying a liquid to the chip placement regions, a chip placing step of placing the chips on the liquid to position the chips in the chip placement regions by the surface tension of the liquid after carrying out the liquid supplying step, and a liquid removing step of removing the liquid to arrange the plurality of chips on the wafer after carrying out the chip placing step.

3 Claims, 9 Drawing Sheets (52) U.S. Cl.
CPC .............. *H01L 2224/83907* (2013.01); *H01L 2224/95* (2013.01); *H01L 2224/95146* (2013.01); *H01L 2224/97* (2013.01); *H01L 2924/12042* (2013.01)

(56) References Cited

U.S. PATENT DOCUMENTS

| | | | | |
|---|---|---|---|---|
| 2011/0249113 | A1* | 10/2011 | Koyanagi | H01L 21/568 |
| | | | | 348/95 |
| 2012/0021563 | A1* | 1/2012 | Koyanagi | H01L 21/6835 |
| | | | | 438/107 |
| 2012/0056228 | A1* | 3/2012 | Horng | H01L 33/486 |
| | | | | 257/98 |
| 2012/0184069 | A1* | 7/2012 | Wimplinger | H01L 21/568 |
| | | | | 438/109 |
| 2012/0292775 | A1* | 11/2012 | Nakamura | H01L 24/29 |
| | | | | 257/773 |
| 2012/0306032 | A1* | 12/2012 | Noda | B23K 20/023 |
| | | | | 257/417 |
| 2013/0140713 | A1* | 6/2013 | Yu | H01L 23/544 |
| | | | | 257/782 |
| 2015/0048523 | A1* | 2/2015 | Suga | H01L 24/74 |
| | | | | 257/777 |

* cited by examiner

CHIP ARRANGING METHOD

BACKGROUND OF THE INVENTION

Field of the Invention

The present invention relates to a chip arranging method for arranging plural chips.

Description of the Related Art

In recent years, manufacturing of packages that are obtained by forming a redistribution layer outside device chips (chips) by using a wafer-level redistribution technique and are called an FOWLP (Fan-Out Wafer Level Package) has been started (refer to e.g. Japanese Patent Laid-open No. 2013-58520). The FOWLP is advantageous for size reduction compared with existing packages using wire bonding or the like because the connection between the chip and a package substrate is established by a thin-film distribution layer.

For the manufacturing of the FOWLP, a process called a chip-first method is employed for example. In the chip-first method, first, chips arranged at arbitrary intervals are sealed by resin or the like to form a pseudo-wafer, and a distribution layer is provided on this pseudo-wafer. Thereafter, the pseudo-wafer is divided along planned dividing lines among the chips. Therefore, plural packages can be obtained.

Furthermore, a process called an RDL-first (Redistribution Layer-first) method is employed in some cases. In the RDL-first method, chips are arranged on a support wafer on which a distribution layer is provided and are sealed by resin or the like. Thereafter, the support wafer is removed and dividing into plural packages is performed. In this RDL-first method, for example, the chips can be so arranged as to avoid a faulty part of the distribution layer and thus the yield can be easily enhanced compared with the chip-first method.

SUMMARY OF THE INVENTION

In the above-described chip-first method and the RDL-first method, chips need to be arranged with high accuracy in order to surely establish the connection to the distribution layer formed at a high density. However, transfer apparatus to arrange the chips decides the position after transfer by determining the position before the transfer on the basis of the outer peripheral edge of each chip for example. Therefore, a deviation of about several tens of micrometers is often caused in the position of the chip after the transfer.

Thus, an object of the present invention is to provide a chip arranging method that can arrange chips with high accuracy.

In accordance with an aspect of the present invention, there is provided a chip arranging method for arranging a plurality of chips on a wafer. The chip arranging method includes a groove forming step of forming a plurality of intersecting grooves that mark off each of chip placement regions on the front surface side of the wafer, a liquid supplying step of supplying a liquid to the chip placement regions, a chip placing step of placing the chips on the liquid to position the chips in the chip placement regions by the surface tension of the liquid after carrying out the liquid supplying step, and a liquid removing step of removing the liquid to arrange the plurality of chips on the wafer after carrying out the chip placing step.

Furthermore, in the present invention, it is preferable that the liquid removing step is carried out by placing, in a vacuum, the wafer over which the plurality of chips are placed with the intermediary of the liquid.

Furthermore, in the present invention, it is preferable that the liquid contains an adhesive component to fix the chips onto the wafer.

In the chip arranging method according to the present invention, the plurality of grooves that mark off the chip placement regions are formed on the front surface side of the wafer. Then, the liquid is supplied to these chip placement regions and the chips are placed thereon. Therefore, the placed chips are positioned in the chip placement regions due to the surface tension of the liquid. Thereafter, the liquid in the chip placement regions is removed. This can arrange the plurality of chips on the wafer. In this manner, the chip arranging method according to the present invention allows the chips to be arranged with high accuracy by utilizing the surface tension of the liquid.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Embodiments of the present invention will be described with reference to the accompanying drawings. A chip arranging method according to the present invention includes a groove forming step (see FIGS. 1A, 1B, and 5), a liquid supplying step (see FIGS. 2 and 6), a chip placing step (see FIGS. 3A, 3B, 7A, and 7B), and a liquid removing step (see FIGS. 4 and 8). In the groove forming step, plural grooves that mark off chip placement regions are formed on the front surface side of a wafer. In the liquid supplying step, a liquid is supplied to each of the plural chip placement regions marked off. In the chip placing step, chips are so placed as to get contact with the supplied liquid and the surface tension of the liquid is made to act on the chips. In the liquid removing step, the liquid is removed to arrange the chips on the wafer.

Details of the chip arranging method according to the present invention will be described below. In a first embodiment to be described below, a chip arranging method for arranging plural chips having the same size on a wafer will be described. In a second embodiment, a chip arranging method for arranging plural chips having different sizes on a wafer will be described.

First Embodiment

Figure 1A:
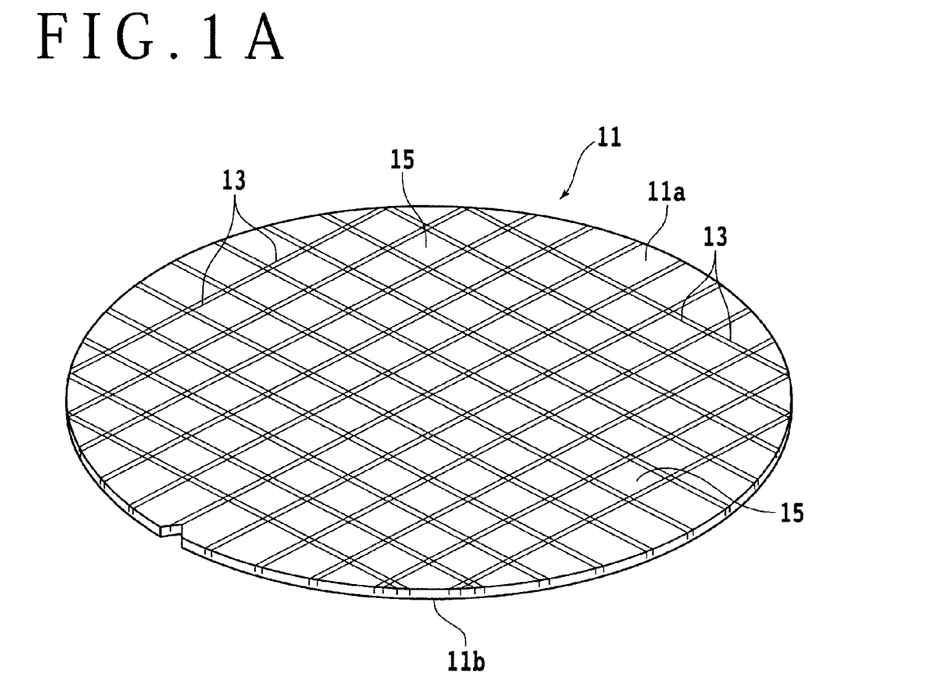
FIG. 1A is a perspective view schematically showing a groove forming step according to a first embodiment.
Figure 1B:
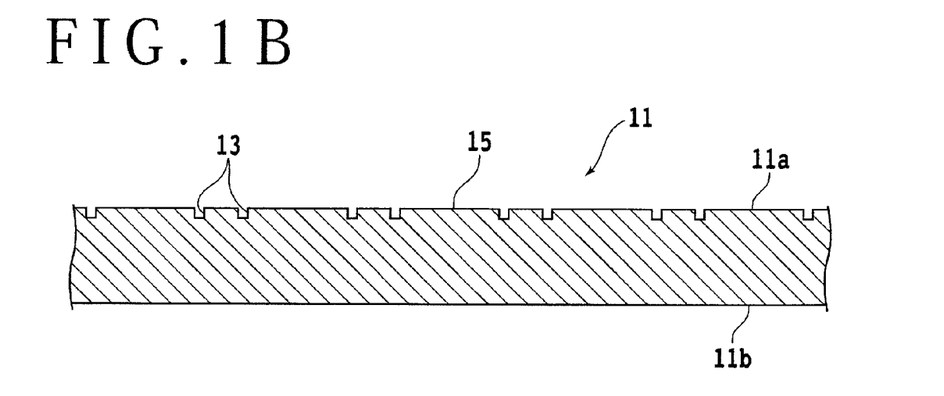
FIG. 1B is a sectional view schematically showing the groove forming step.

In the present embodiment, a chip arranging method for arranging plural chips having the same size on a wafer will be described. In the chip arranging method of the present embodiment, first, a groove forming step of forming plural grooves that mark off chip placement regions on the front surface side of a wafer on which chips are to be arranged is carried out. FIG. 1A is a perspective view schematically showing the groove forming step and FIG. 1B is a sectional view schematically showing the groove forming step. As shown in FIGS. 1A and 1B, a wafer 11 is a semiconductor wafer or the like having a circular disc shape and has a substantially-flat front surface 11a on which to arrange chips. In the groove forming step, plural intersecting grooves 13 are formed on the side of the front surface 11a of this wafer 11. The side of the front surface 11a of the wafer 11 is partitioned into plural chip placement regions 15 on which to place chips by the plural grooves 13.

The grooves 13 can be formed by cutting into the wafer 11 with a rotating cutting blade having a circular ring shape to a predetermined depth from the front surface 11a and moving the cutting blade and the wafer 11 relative to each other for example. Alternatively, the grooves 13 may be formed by irradiating the wafer 11 with a laser beam having such a wavelength as to be easily absorbed and causing ablation of the side of the front surface 11a. Conditions such as the width, depth, positions, number, and so forth of the grooves 13 are changed according to the shape, size, weight, arrangement (interval), and so forth of the chips to be arranged. For example, in the present embodiment, the grooves 13 as parallel groove sets in which each one groove set is composed of two grooves are formed in conformity with the width of the grooves 13 formed and the interval between adjacent chips (i.e. interval of the chip placement regions 15). Furthermore, in the present embodiment, the plural grooves 13 that mark off the plural chip placement regions 15 at equal intervals are formed in order to arrange plural chips at equal intervals. On the other hand, in the case of arranging plural chips at different intervals, the plural grooves 13 that mark off the plural chip placement regions 15 at different intervals are formed.

The shape of the chip placement regions 15 in plan view is a rectangle typically. However, the shape of the chip placement regions 15 in plan view is properly changed according to the shape of the chips in plan view. For example, when the chips have a polygonal shape in plan view, the chip placement regions 15 also have a polygonal shape in plan view. When the chips have a circular shape in plan view, the chip placement regions 15 also have a circular shape in plan view. The size (area) of the chip placement regions 15 in plan view is equivalent to the size (area) of the chips in plan view for example. However, the size of the chip placement regions 15 in plan view can be arbitrarily changed within a range in which the chips can be properly arranged. That is, the size of the chip placement regions 15 in plan view may be set smaller or larger than the size of the chips in plan view. Although the plural chip placement regions 15 having the same shape and size are formed in FIGS. 1A and 1B, the shape and size of the chip placement regions 15 each do not need to be one type. For example, in the case of arranging different kinds of chips, the chip placement regions 15 having different shapes and sizes may be provided according to the kinds of chips.

Figure 2:
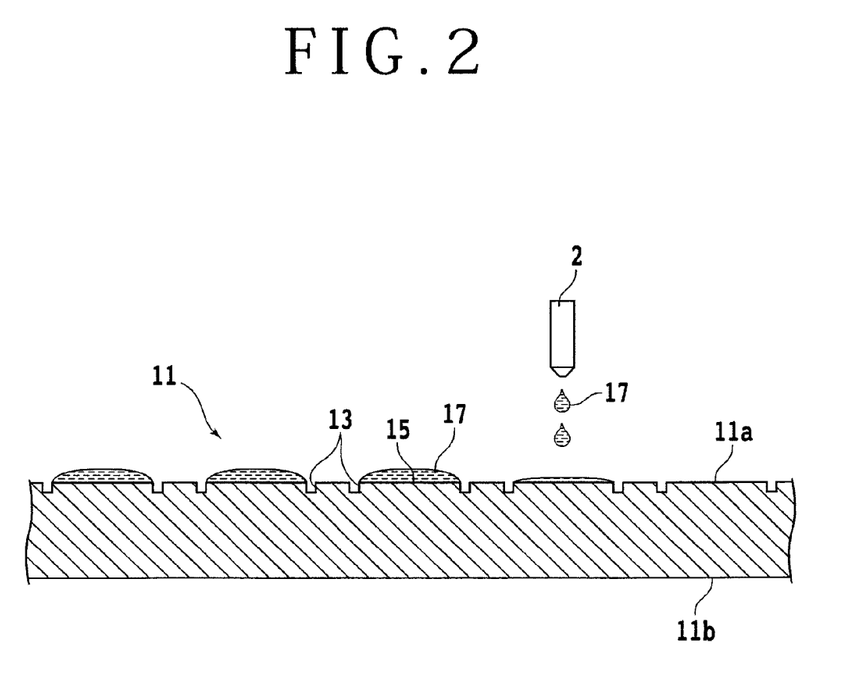
FIG. 2 is a sectional view schematically showing a liquid supplying step according to the first embodiment.

After the groove forming step, a liquid supplying step of supplying a liquid to each of the plural chip placement regions 15 is carried out. FIG. 2 is a sectional view schematically showing the liquid supplying step. As shown in FIG. 2, in the liquid supplying step, first, the side of a back surface 11b of the wafer 11 is so fixed that the side of the front surface 11a is exposed. In this state, a nozzle 2 for liquid supply is positioned above the chip placement region 15 as a target. Next, a liquid 17 is dropped from the nozzle 2 to be supplied to the target chip placement region 15. As this liquid 17, e.g. water (pure water) can be used. The amount of liquid 17 supplied by the nozzle 2 is set to such a degree that the liquid 17 does not flow out to the outside of the grooves 13 surrounding the target chip placement region 15. After the liquid 17 is supplied to the target chip placement region 15, the nozzle 2 and the wafer 11 are moved relative to each other and the nozzle 2 for liquid supply is positioned above the adjacent chip placement region 15. Then, the liquid 17 is dropped from the nozzle 2 to be supplied to the adjacent chip placement region 15. When the liquid 17 is supplied to all chip placement regions 15 through the repetition of this operation, the liquid supplying step ends.

Although water (pure water) is used as the liquid 17 in the present embodiment, another liquid in which some degree of surface tension is obtained may be used. Furthermore, the liquid 17 may be mixed with another substance for controlling the viscosity and the adhesiveness. For example, if the contact angle of the liquid 17 is increased by adding an additive agent to the liquid 17, the flow-out of the liquid 17 to the outside of the grooves 13 is suppressed. Furthermore, in e.g. the case of sealing arranged chips on the wafer 11, if the liquid 17 is mixed with an adhesive (adhesive component), the chips can be fixed onto the wafer 11 and the movement of the chips in association with the contraction of a sealant and so forth can be restricted.

Figure 3A:
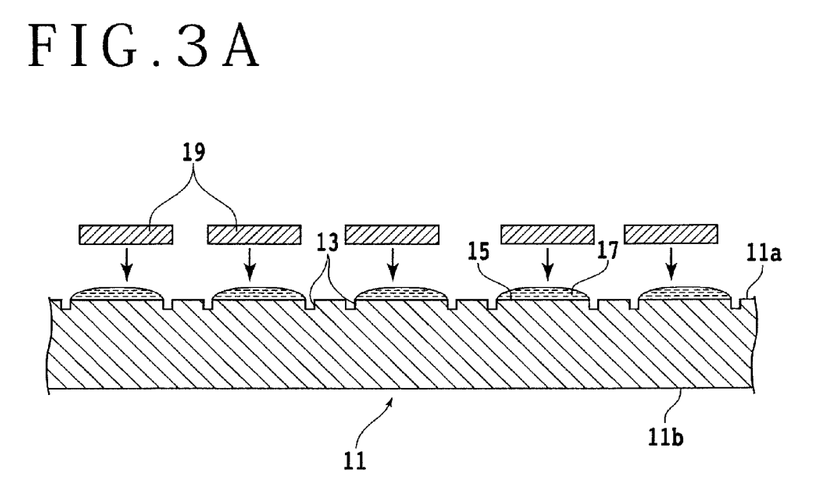
FIG. 3A is a sectional view schematically showing a chip placing step according to the first embodiment.
Figure 3B:
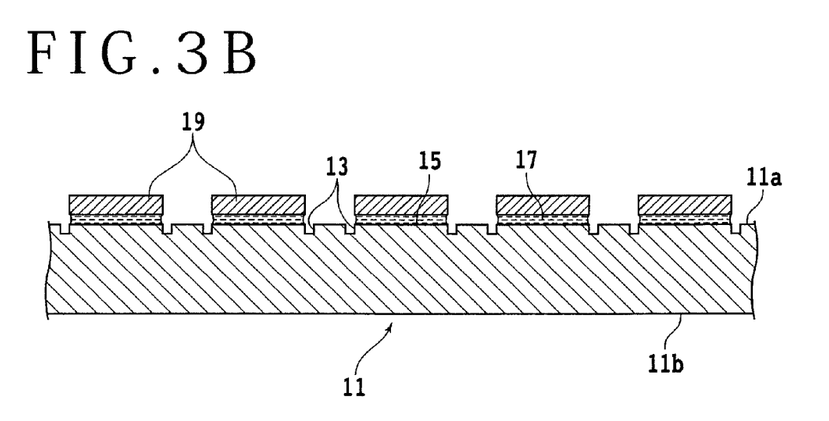
FIG. 3B is a sectional view schematically showing a state in which chips are positioned in chip placement regions.

After the liquid supplying step, a chip placing step of placing chips in such a manner that the chips get contact with the supplied liquid 17 and making the surface tension of the liquid 17 act on the chips is carried out. FIG. 3A is a sectional view schematically showing the chip placing step and FIG. 3B is a sectional view schematically showing a state in which the chips are positioned in the chip placement regions 15. As shown in FIG. 3A, in the chip placing step, plural chips 19 are placed on the side of the front surface 11a of the wafer 11. Specifically, the chip 19 is placed at each of the positions overlapping with the liquid 17 (on the liquid 17) in the respective chip placement regions 15. However, this placing is so performed that the chip 19 that should be placed in each chip placement region 15 does not get contact with the liquid 17 of another chip placement region 15. As a result, the chips 19 move due to the action of the surface tension (and buoyancy) of the liquid 17 and are positioned at the locations overlapping with the chip placement regions 15 as shown in FIG. 3B. That is, the chips 19 are arranged in a form corresponding to the arrangement of the chip placement regions 15.

Figure 4:
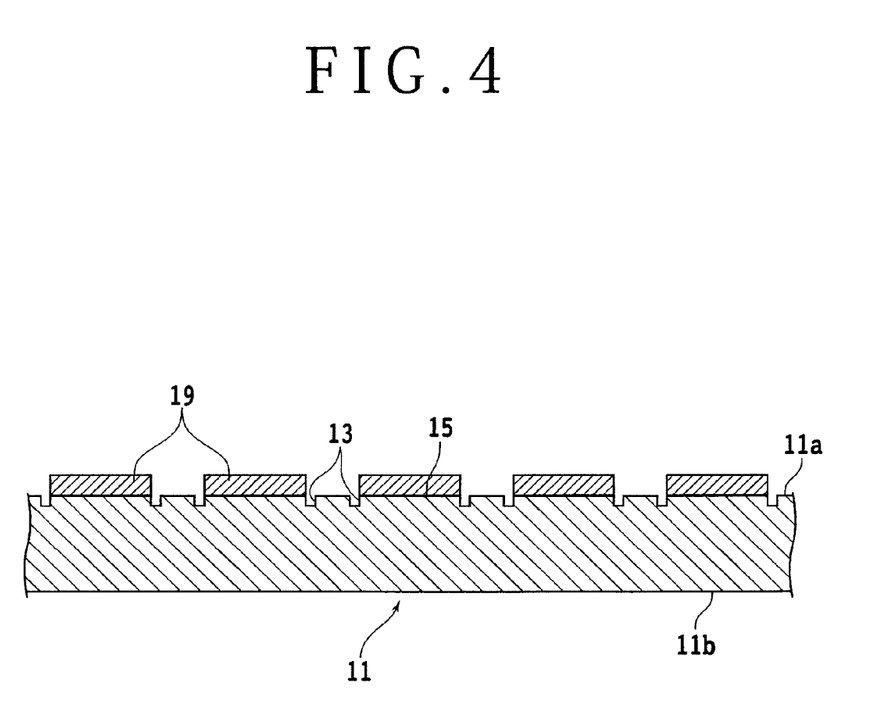
FIG. 4 is a sectional view schematically showing a liquid removing step according to the first embodiment.

After the chip placing step, a liquid removing step of removing the liquid 17 is carried out. FIG. 4 is a sectional view schematically showing the liquid removing step. In this liquid removing step, for example, the wafer 11 on which the plural chips 19 are placed is disposed in a vacuum (reduced pressure) atmosphere to evaporate the liquid 17. As a result, as shown in FIG. 4, the plural chips 19 can be arranged on the front surface 11a of the wafer 11. In this liquid removing step, the wafer 11 on which the plural chips 19 are placed may be disposed in a heated atmosphere to evaporate the liquid 17. It is also possible to remove the liquid 17 by natural drying.

After the liquid removing step, an arbitrary processing step can be carried out. For example, the plural chips 19 arranged on the wafer 11 may be transferred to another area by transfer apparatus. Because the chips 19 before the transfer are arranged with high accuracy by the chip arranging method of the present embodiment, positional deviations and so forth of the chips after the transfer can be sufficiently suppressed. Furthermore, it is also possible to seal the plural chips 19 arranged on the wafer 11 by resin or the like and form a pseudo-wafer of the chip-first method. Moreover, it is also possible to form packages by the RDL-first method by using the wafer 11 on which a distribution layer (a rewiring layer) is formed or forming a distribution layer on the wafer 11.

As described above, in the chip arranging method according to the present embodiment, the plural grooves 13 that mark off the chip placement regions 15 are formed on the side of the front surface 11a of the wafer 11. Then, the liquid 17 is supplied to these chip placement regions 15 and the chips 19 are placed thereon. Therefore, the placed chips 19 are positioned in the chip placement regions 15 due to the surface tension of the liquid 17. Thereafter, the liquid 17 in the chip placement regions 15 is removed. This can arrange the plural chips 19 on the wafer 11. In this manner, the chip arranging method according to the present embodiment allows the chips 19 to be arranged with high accuracy by utilizing the surface tension of the liquid 17.

Second Embodiment

In the present embodiment, a chip arranging method for arranging plural chips 19 having different sizes on a wafer 11 will be described. The chip arranging method according to the present embodiment is in common with the chip arranging method according to the first embodiment in many points. So, in the present embodiment, detailed description about common parts is omitted.

Figure 5:
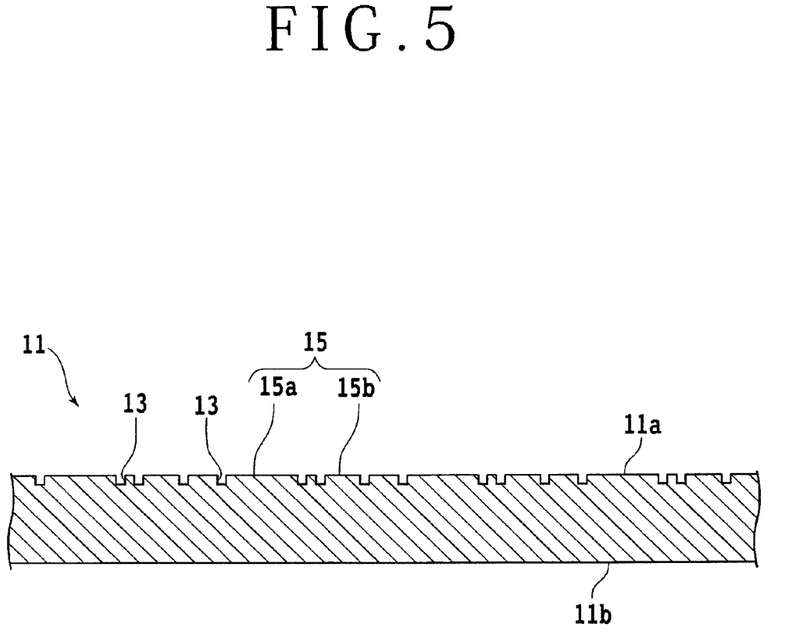
FIG. 5 is a sectional view schematically showing a groove forming step according to a second embodiment.

First, a groove forming step of forming plural grooves 13 that mark off chip placement regions 15 on the side of a front surface 11a of the wafer 11 on which the chips 19 are to be arranged is carried out. FIG. 5 is a sectional view schematically showing the groove forming step. In the groove forming step of the present embodiment, the plural intersecting grooves 13 are formed on the side of the front surface 11a of the wafer 11 to partition the front surface 11a of the wafer 11 into first chip placement regions 15a and second chip placement regions 15b that are different in shape, size, and so forth. In FIG. 5, two kinds of chip placement regions 15 different in shape, size, and so forth are formed. However, three or more kinds of chip placement regions 15 may be formed. The kinds of chip placement regions 15 can be arbitrarily changed according to the kinds of chips 19 to be arranged.

Figure 6:
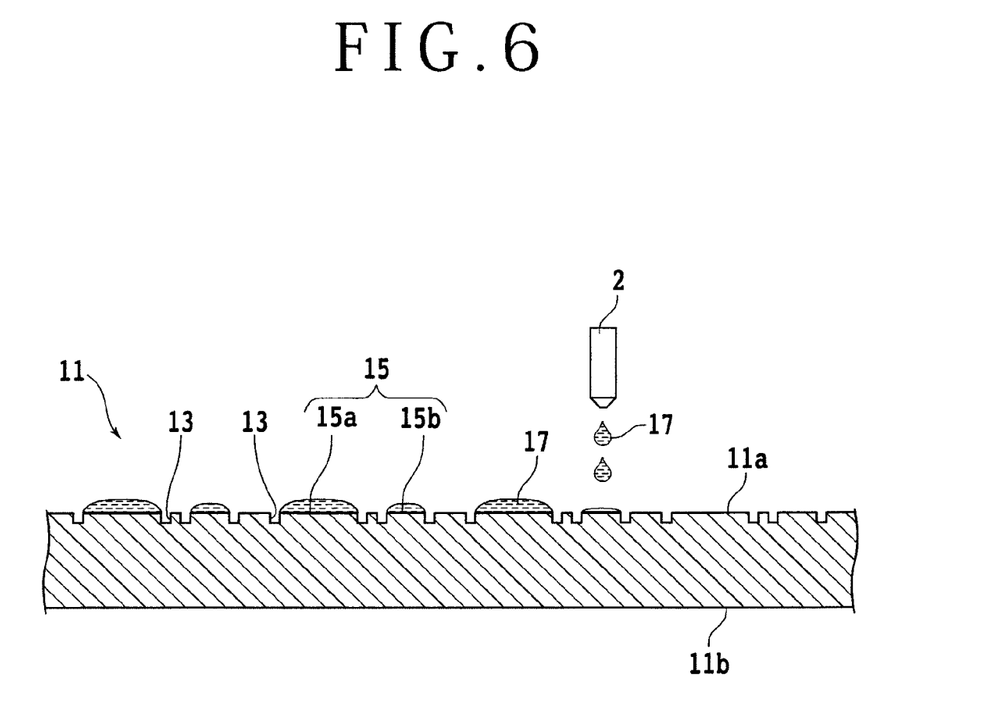
FIG. 6 is a sectional view schematically showing a liquid supplying step according to the second embodiment.

After the groove forming step, a liquid supplying step of supplying a liquid to each of the plural chip placement regions 15 is carried out. FIG. 6 is a sectional view schematically showing the liquid supplying step. As shown in FIG. 6, in the liquid supplying step of the present embodiment, the amount of liquid 17 to be supplied is adjusted according to the size and so forth of the chip placement region 15 so that the liquid 17 may be prevented from flowing out to a region outside the grooves 13 surrounding the chip placement region 15.

Figure 7A:
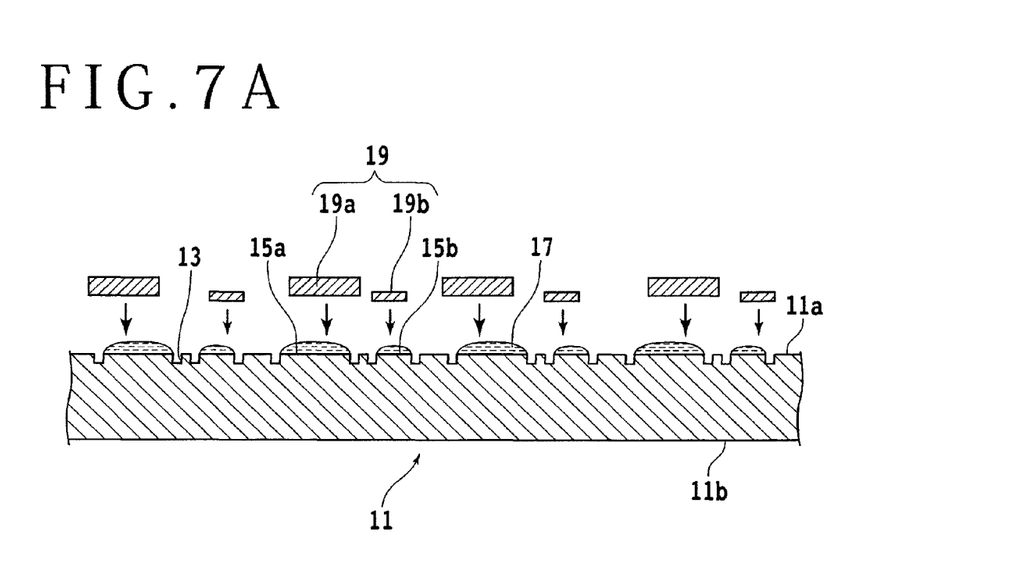
FIG. 7A is a sectional view schematically showing a chip placing step according to the second embodiment.
Figure 7B:
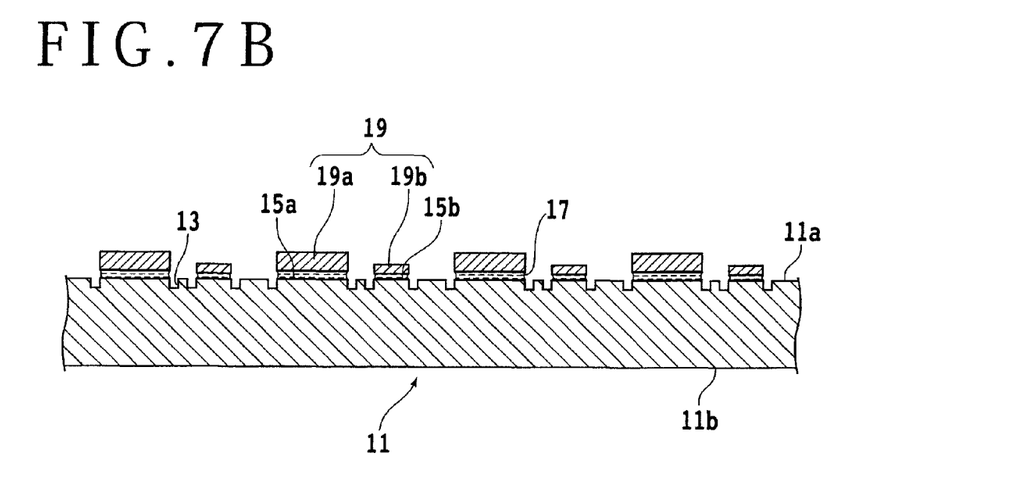
FIG. 7B is a sectional view schematically showing a state in which chips are positioned in chip placement regions.

After the liquid supplying step, a chip placing step of placing chips in such a manner that the chips get contact with the supplied liquid 17 and making the surface tension of the liquid 17 act on the chips is carried out. FIG. 7A is a sectional view schematically showing the chip placing step and FIG. 7B is a sectional view schematically showing a state in which the chips are positioned in the chip placement regions 15. As shown in FIG. 7A, in the chip placing step of the present embodiment, first chips 19a corresponding to the first chip placement regions 15a are placed at the positions overlapping with the liquid 17 (on the liquid 17) in the first chip placement regions 15a. Furthermore, second chips 19b corresponding to the second chip placement regions 15b are placed at the positions overlapping with the liquid 17 (on the liquid 17) in the second chip placement regions 15b. As a result, the two kinds of chips 19 each move due to the action of the surface tension (and buoyancy) of the liquid 17, so that the first chips 19a are positioned at the locations overlapping with the first chip placement regions 15a and the second chips 19b are positioned at the locations overlapping with the second chip placement regions 15b as shown in FIG. 7B. That is, the two kinds of chips 19 are arranged in a form corresponding to the arrangement of the two kinds of chip placement regions 15.

Figure 8:
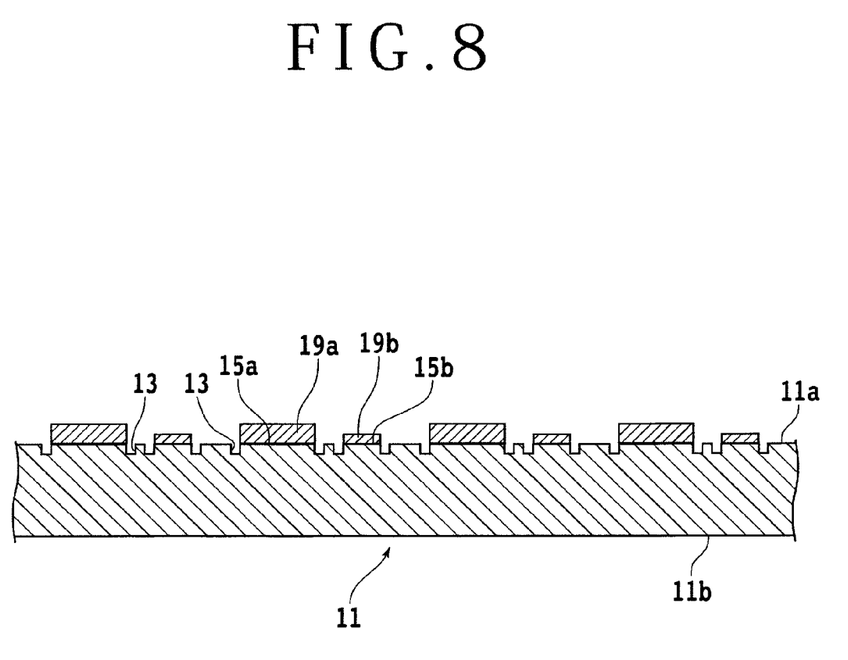
FIG. 8 is a sectional view schematically showing a liquid removing step according to the second embodiment.

After the chip placing step, a liquid removing step of removing the liquid 17 is carried out. FIG. 8 is a sectional view schematically showing the liquid removing step. As shown in FIG. 8, by removing the liquid 17, the two kinds of chips 19 can be arranged on the front surface 11a of the wafer 11.

In this manner, also by the chip arranging method according to the present embodiment, the chips 19 can be arranged with high accuracy by utilizing the surface tension of the liquid 17. The configuration, method, and so forth shown in the present embodiment can be combined with configuration, method, and so forth according to another embodiment as appropriate.

The present invention is not limited to the description of the above embodiments and can be carried out with various changes. For example, in e.g. the case of forming packages by the RDL-first method, if the deep grooves 13 are formed in the wafer 11 having a distribution layer, the distribution layer and the grooves 13 interfere with each other. Furthermore, the strength of the wafer 11 is lowered attributed to the deep grooves 13 in some cases. So, when such phenomena become a problem, the grooves 13 that are shallow and have a wide width may be formed instead of the deep grooves 13.

Figure 9:
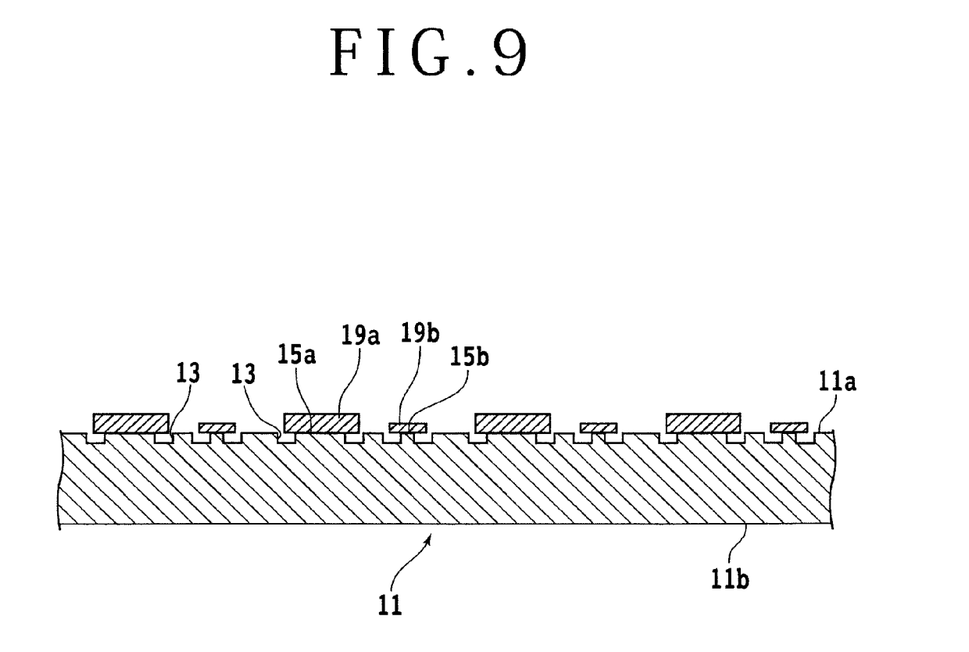
FIG. 9 is a sectional view schematically showing a chip arranging method according to a modification example.

FIG. 9 is a sectional view schematically showing a chip arranging method according to a modification example. In FIG. 9, by forming the grooves 13 that are shallow and have a wide width, the inner peripheral edges of the grooves 13 are positioned inside the outer peripheral edges of the chips 19. In this case, the sizes of the chip placement regions 15 in plan view are slightly smaller than the sizes of the chips 19 in plan view. If the grooves 13 are made shallow and the width thereof is widened as shown in FIG. 9, the volume of the grooves 13 can be sufficiently ensured even in the case of forming packages by the RDL-first method and so forth. This suppresses the flow-out of the liquid 17 supplied to the chip placement regions 15 to the outside of the grooves 13. Furthermore, the lowering of the strength of the wafer 11 can be prevented.

Moreover, in e.g. the case of sealing the arranged chips 19 on the wafer 11, an adherent layer formed of an adhesive, a double-sided tape, or the like may be formed on the front surface 11a of the wafer 11 before the groove forming step or the liquid supplying step. This can fix the chips 19 onto the wafer 11 and thus can restrict the movement of the chips 19 in association with the contraction of a sealant and so forth.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A chip arranging method for arranging a plurality of chips on a wafer, the chip arranging method comprising:
    a groove forming step of forming a plurality of intersecting grooves that are exposed and mark off a plurality of chip placement regions, the size of the chip placement regions being equivalent to the size of the chips, on a front surface side of the wafer;
    a liquid supplying step of supplying water to the chip placement regions surrounded by the exposed grooves;
    a chip placing step of placing the chips on the water to position the chips in the chip placement regions by surface tension of the water after carrying out the liquid supplying step; and
    a liquid removing step of removing the water to arrange the plurality of chips on the wafer after carrying out the chip placing step,
    wherein said liquid removing step is carried out by placing, in a heated atmosphere, the wafer over which the plurality of chips are placed with the intermediary of the water, and
    an amount of water supplied to the chip placement regions is set to such a degree that water does not flow out to the outside of the grooves surrounding the chip placement regions.

2. The chip arranging method according to claim 1, wherein
    the liquid removing step is carried out by placing, in a vacuum, the wafer over which the plurality of chips are placed with intermediary of the water.

3. The chip arranging method according to claim 1, wherein
    the water contains an adhesive component to fix the chips onto the wafer.

* * * * *